(12) United States Patent
Simon et al.

(10) Patent No.: US 8,178,416 B2
(45) Date of Patent: May 15, 2012

(54) METHOD FOR MAKING AN ELECTRICALLY CONDUCTING MECHANICAL INTERCONNECTION MEMBER

(75) Inventors: Patrice Simon, Toulouse (FR);
Pierre-Louis Taberna, Escalquens (FR);
Thierry Lebey, Lacroix Falgarde (FR);
Jean Pascal Cambronne, Mervilla (FR);
Vincent Bley, Escalquens (FR); Quoc Hung Luan, Toulouse (FR); Jean Marie Tarascon, Mennecy (FR)

(73) Assignees: Centre National de la Recherche Scientifique, Paris (FR); Universite Paul Sabatier, Toulouse (FR)

( * ) Notice: Subject to any disclaimer, the term of this patent is extended or adjusted under 35 U.S.C. 154(b) by 53 days.

(21) Appl. No.: 12/739,848

(22) PCT Filed: Oct. 24, 2008

(86) PCT No.: PCT/FR2008/001497
§ 371 (c)(1),
(2), (4) Date: Aug. 23, 2010

(87) PCT Pub. No.: WO2009/090349
PCT Pub. Date: Jul. 23, 2009

(65) Prior Publication Data
US 2010/0308473 A1    Dec. 9, 2010

(30) Foreign Application Priority Data
Oct. 26, 2007 (FR) ...................................... 07 07566

(51) Int. Cl.
*H01L 21/76* (2006.01)
(52) U.S. Cl. . 438/409; 438/408; 438/441; 257/E23.169; 257/777; 204/237

(58) Field of Classification Search ............ 257/E21.09, 257/E21.575, E21.506, E23.097, E23.169, 257/E25.013, 685, 686, 723, 777; 438/107, 438/121, 408, 409, 441, 442, 678, 758, 927, 438/FOR. 390; 204/554, 222, 242, 275.1, 204/228.6, 278, 237, 256, 270, 221; 205/112, 205/118; 29/432
See application file for complete search history.

(56) References Cited

U.S. PATENT DOCUMENTS

| 5,877,069 | A  | * | 3/1999  | Robinson     | 438/441 |
| 6,231,744 | B1 |   | 5/2001  | Ying et al.  | 205/324 |
| 6,331,474 | B1 | * | 12/2001 | Hayashi et al.| 438/476 |

(Continued)

FOREIGN PATENT DOCUMENTS

EP    1 100 106    5/2001

(Continued)

*Primary Examiner* — Chris Chu
(74) *Attorney, Agent, or Firm* — Oblon, Spivak, McClelland, Maier & Neustadt, L.L.P.

(57) ABSTRACT

A method of fabricating an electrically conductive mechanical interconnection element (12) comprises: a first stage of electrochemically depositing a structure comprising a plurality of metal wires (2a) of sub-micrometric diameter projecting from the likewise metallic surface of a substrate (2); and a second stage of controlled partial dissolution of said wires to reduce their diameter. A method of making a mechanical and/or electrical interconnection, the method comprising the steps consisting in: fabricating two interconnection elements by a method as described above; and placing said interconnection elements face to face and pressing one against the other so as to cause the nanometric wires projecting from the surfaces of said elements to interpenetrate and tangle together. A three-dimensional electronic device comprising a stack of microelectronic chips mechanically and electrically connected to one another by such interconnection elements.

18 Claims, 2 Drawing Sheets

U.S. PATENT DOCUMENTS

| | | | |
|---|---|---|---|
| 6,417,069 B1 * | 7/2002 | Sakaguchi et al. | 438/408 |
| 6,572,748 B1 * | 6/2003 | Herrmann et al. | 204/435 |
| 6,741,019 B1 | 5/2004 | Filas et al. | 313/355 |
| 7,967,967 B2 * | 6/2011 | James et al. | 204/554 |
| 2005/0224975 A1 | 10/2005 | Basavanhally et al. | 257/741 |
| 2006/0043598 A1 | 3/2006 | Kirby et al. | 257/774 |
| 2006/0097252 A1 | 5/2006 | Basavanhally et al. | 257/41 |
| 2006/0125109 A1 | 6/2006 | Kirby et al. | 257/774 |
| 2006/0180941 A1 | 8/2006 | Kirby et al. | 257/774 |
| 2008/0001306 A1 | 1/2008 | Basavanhally et al. | 257/777 |
| 2008/0169563 A1 | 7/2008 | Awano et al. | 257/746 |
| 2008/0230390 A1 * | 9/2008 | Cohen | 205/118 |
| 2009/0045067 A1 * | 2/2009 | Mishima et al. | 205/118 |
| 2009/0321272 A1 * | 12/2009 | Kato et al. | 205/351 |
| 2009/0325390 A1 * | 12/2009 | Domon et al. | 438/758 |

FOREIGN PATENT DOCUMENTS

| | | |
|---|---|---|
| EP | 1 100 297 | 5/2001 |
| EP | 1 320 111 | 6/2003 |
| EP | 1 583 146 | 10/2005 |
| WO | 2006 098026 | 9/2006 |
| WO | 2006 123049 | 11/2006 |

* cited by examiner

METHOD FOR MAKING AN ELECTRICALLY CONDUCTING MECHANICAL INTERCONNECTION MEMBER

BACKGROUND OF THE INVENTION

The invention relates to a method of fabricating an electrically conductive mechanical interconnection element, and to a method of making a mechanical interconnection.

The invention applies in particular to the field of electronics.

In electronics, it is constantly necessary to make electrically conductive mechanical interconnections.

This applies in particular to connecting the pins of a microelectronic chip to a track or an area of metal plating on a printed circuit for making an electronics card.

Typically, such electrical and mechanical connections are made by soldering or by thermo-compression. Those conventional techniques present numerous drawbacks. Firstly they require high temperatures to be used, which can damage fragile electronic components. Secondly they are not easily taken apart. Unfortunately, it is often important to be able to remove and replace a chip of an electronics card, for test, repair, and/or replacement purposes.

Interconnection problems are particularly severe with electronic components for three-dimensional integration performed by stacking and interconnecting planar devices such as chips or miniature printed circuits. Once such an assembly has been made, it is generally not possible to take it apart without destroying the planar elements making it up.

Document EP 1 583 146 discloses a nanostructured interconnection element constituted by a metal surface from which there project conductive wires of sub-micrometric diameter ("nanowires"). A mechanical and electrical interconnection is made by pressing said surfaces one against the other. This causes the nanowires to tangle together, thereby creating a bond between the surfaces. The interconnection obtained in that way can be undone merely by applying sufficient traction force, and then it can be re-established by a new compression step.

Document EP 1 583 146 does not describe in detail any method for enabling such an interconnection element to be fabricated, being content merely to cite prior document U.S. Pat. No. 6,185,961.

That document describes a method of fabricating a plurality of metallic nanowires projecting from a surface, the method comprising: fabricating a porous matrix out of glass; depositing a layer of a noble metal on one face of said matrix by vaporization or spraying; fabricating nanowires by electrochemical deposition in the pores of the matrix; and dissolving the matrix to release the resulting nanostructured metallic element. That method is very complex and expensive, particularly concerning the steps of fabricating and metal-plating the matrix. Furthermore, the need for a step of depositing an electronically-conductive thin film by spraying or by vaporization limits the range of materials that can be used. For example, it is not possible to make a nanostructure entirely out of copper.

Other methods of fabricating structures constituted by a plurality of conductive nanowires projecting from a surface are known in the prior art. Nevertheless, those structures are found to be unsuitable for making mechanical interconnections by tangling nanowires together.

For example, the article by S. Fiedler et al. "Evaluation of metallic nano-lawn structures for application in microelectronic packaging" describes a method of fabricating such a nanostructure by an electrolytic method generally similar to that of document U.S. Pat. No. 6,185,961, except in that the glass matrix is replaced by a polymer membrane in which pores are formed by bombarding it with particles. The drawback of that method is that the pores obtained in that way (and thus the nanowires that are deposited therein) are not rectilinear and their disposition is random. Experience shows that a satisfactory interconnection cannot be achieved in that way. At best, the method enables nanostructures to be created on metal-plated areas of microelectronic chips or printed circuits, thereby making them easier to connect by soldering.

Document WO 2006/123049 discloses yet another method of fabricating a nanostructure constituted by a plurality of metallic nanowires projecting from a surface of a substrate. That method likewise provides for forming nanowires by electrochemical deposition in the pores of a sacrificial matrix. The originality of the method lies in using a matrix constituted by a membrane made of a porous ceramic material, and more particularly of alumina. The method of document WO 2006/123049 is advantageous since the pores of alumina membranes are substantially rectilinear and they are arranged in a regular array. In addition, there is no need to proceed with a prior step of metal-plating said membrane by vaporization or spraying.

Nevertheless, the present inventors have observed that the structures obtained in that way do not enable mechanical interconnections to be obtained by the nanowires interpenetrating and tangling together, even though they have performed a plurality of tests with various different commercially-available porous alumina membranes. Document WO 2006/123049 does not describe such an application.

SUMMARY OF THE INVENTION

An object of the present invention is to remedy the above-mentioned drawbacks of the prior art in order to provide a simple and inexpensive method of making mechanical interconnection elements of the type based on conductive nanowires interpenetrating and tangling together.

Such an object may be achieved by a method of fabricating an electrically conductive mechanical interconnection element, said method comprising the steps consisting in:

i) placing in an electrolytic cell, an electrolytic solution of a compound that is a precursor of a metallic material;

ii) immersing in said solution a conductive substrate having at least one face coated in a porous membrane presenting a substantially regular array of rectilinear through pores;

iii) providing an electrode facing said or each porous membrane, but spaced apart therefrom;

iv) connecting said substrate to a negative terminal of an electricity generator so as to constitute a cathode, and connecting said electrode to a positive terminal of said generator so as to constitute an anode, in order to perform electrolytic deposition of said metallic material on the surface of the substrate through the pores of said membrane;

v) dissolving said porous membrane so as to release a structure comprising a plurality of wires of sub-micrometric diameter made of said metallic material and projecting from the surface of said substrate; said method being characterized in that it further comprises an additional step of:

vi) controlled partial dissolution of said wires to reduce the diameter thereof so as to increase the force of adhesion that acts between two said structures as a result of said wires interpenetrating and tangling together when the structures are pressed one against the other.

In particular embodiments of the invention:

Said porous membrane may be made of a ceramic material, and more particularly of alumina.

Said porous membrane may present pore density lying in the range $10^7$ per square centimeter ($cm^{-2}$) to $10^{10}$ $cm^{-2}$, and preferably of about $10^9$ $cm^{-2}$.

After said step vi) of controlled partial dissolution, said wires may present a diameter lying in the range 5 nanometers (nm) to 300 nm, and preferably in the range 10 nm to 200 nm, and/or a length lying in the range 200 nm to 200 micrometers (μm), and preferably in the range 500 nm to 100 μm.

Likewise, after said step vi) of controlled partial dissolution, said interconnection element may present porosity lying in the range 0.5 to 0.9.

Said metallic material may be selected from: Cu, Sn, Co, Fe, Pb, Ni, Cr, Au, Pd, Pt, Ag, Bi, Sb, Al, Si, and Li, and alloys of said metals. Preferably, said metallic material may be the same as the material that constitutes said conductive substrate so as to obtain an interconnection structure made of a single material.

Said step of controlled partial dissolution may be an electrolytic dissolution method.

In a variant, said step of controlled partial dissolution may be performed by immersing said structure in a solution enabling said metallic material to be oxidized and also enabling the oxidation products thereof to be dissolved.

Said conductive substrate may be constituted by an area of metal plating on a microelectronic chip, or by a track or an area of metal plating on a printed circuit. In particular, said mechanical interconnection element may also provide an electrical connection.

The invention also provides a method of making a mechanical interconnection, the method comprising the steps consisting in:
 fabricating two interconnection elements by a method as described above; and
 placing said interconnection elements face to face and pressing one against the other so as to cause the nanometric wires projecting from the surfaces of said elements to interpenetrate and tangle together. Advantageously, said interconnection elements may be pressed against one another at a pressure that lies in the range 20 megapascals (MPa) to 100 MPa.

The invention also provides a method of fabricating a three-dimensional microelectronic device constituted by a stack of a plurality of microelectronic chips mechanically and electrically connected to one another, the method being characterized in that at least one mechanical interconnection between said chips is made in accordance with the above-described method.

In a particularly advantageous manner, at least some of the mechanical interconnection elements connecting said microelectronic chips together may form channels that are leaktight for circulating a coolant fluid.

The invention also provides a three-dimensional electronic device comprising a stack of microelectronic chips mechanically and electrically connected to one another, the device being characterized in that adjacent chips in said stack present, on their opposite faces, facing interconnection elements comprising areas of metal plating and a plurality of wires of sub-micrometric diameter projecting therefrom, and in that the chips are interconnected by the wires of said interconnection elements interpenetrating and tangling together.

In particular embodiments of the device of the invention:
 The density of said wires of sub-micrometric diameter may lie in the range $10^7$ $cm^{-2}$ to $10^{10}$ $cm^{-2}$, and is preferably about $10^9$ $cm^{-2}$.
 Said wires may present a diameter lying in the range 5 nm to 300 nm, and preferably in the range 10 nm to 200 nm, and/or a length lying in the range 200 nm to 200 μm, and preferably in the range 500 nm to 100 μm.
 Said interconnection element may present porosity lying in the range 0.5 to 0.9.
 Said wires of sub-micrometric diameter may be made of a metallic material selected from: Cu, Sn, Co, Fe, Pb, Ni, Cr, Au, Pd, Pt, Ag, Bi, Sb, Al, Si, and Li, and alloys of said metals.
 Advantageously, at least some of said interconnection elements may be in the form of parallel strips, not necessarily rectilinear, crossing the chip from one side to another so a to constitute leaktight walls defining at least one tube for circulating a cooling fluid.

Other characteristics, details, and advantages of the invention appear on reading the description made with reference to the accompanying drawings, given by way of example, and in which:

DETAILED DESCRIPTION OF THE PREFERRED EMBODIMENT

Figure 1:
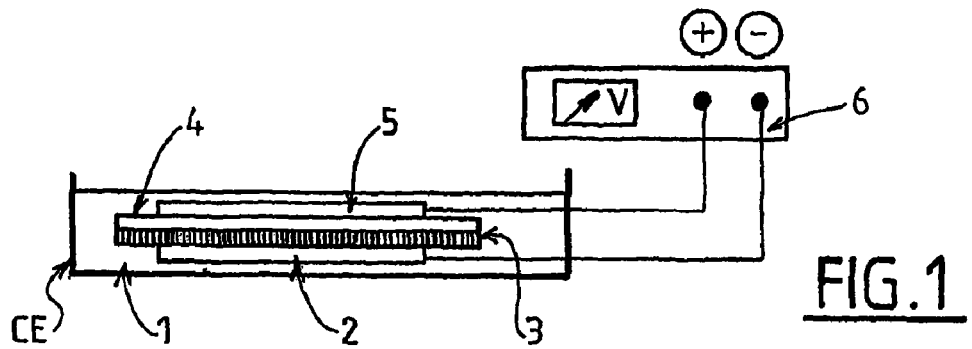
FIG. 1 shows the steps i) to v) of a method of the invention.

The method of fabricating an electrically conductive mechanical interconnection element of the invention comprises two stages. The first stage, shown diagrammatically in FIG. 1, is described in detail in document WO 2006/123049.

It comprises the steps consisting in:

Step i): placing in an electrolytic cell CE, an electrolytic solution 1 of a compound that is a precursor of a metallic material. Typically, the solution may be an aqueous or an organic solution of one or more metallic salts. The metal(s) may be selected in particular from the following: Cu, Sn, Co, Fe, Pb, Ni, Cr, Au, Pd, Pt, Ag, Bi, Sb, Al, Si, and Li. If salts are used of different metals, care should be taken to ensure that the metals are capable of combining in an alloy. As a specific example, the electrolytic solution may be an aqueous solution of $CuSO_4$ (100 grams per liter (g/L)), $(NaH_4)_2SO_4$ (20 g/L), and diethylenetriamine (80 g/L).

Step ii): immersing a conductive substrate 2 in said solution 1, the substrate having at least one face coated in a porous membrane 3 that presents a substantially regular array of rectilinear through pores. The conductive substrate 2 may be constituted by an area of metal plating on a "bare" microelectronic chip, or by a track of an integrated circuit. The membrane is preferably made of alumina, it presents thickness lying in the range a few hundreds of nanometers to a few tens of micrometers, and it presents $10^7$ to $10^{10}$ substantially cylindrical pores (with $10^9$ being a preferred value), having a diameter that is approximately uniform lying in the range 50 nm to 500 nm, and distributed in a regular hexagonal array. A membrane of this type is sold under the name "Anodisc" by the supplier Whatman.

In a variant, membranes constituted by other materials may be used; the most important point is that they present a substantially regular array of rectilinear through bores. In the present state of technology, best results are obtained with alumina membranes. Other ceramic materials such as titanium oxide $TiO_2$ constitute alternatives that are acceptable, even if less satisfactory.

Step iii): providing an electrode 5 facing said or each porous membrane, but spaced apart therefrom. By way of example, the electrode may be constituted by a copper sheet that is spaced apart from the membrane 3 by a permeable cellulose sheet 4.

Step iv): connecting said substrate 2 to a negative terminal of an electricity generator 6 so as to constitute a cathode, and connecting said electrode 5 to a positive terminal of said generator 6 so as to constitute an anode, thereby causing said metallic material to be deposited electrolytically on the surface of the substrate through the pores in said membrane. Deposition may be performed continuously or in pulses. For example, one protocol for implementing the method may provide for a sequence comprising the application of a current of 1 milliamp per square centimeter ($mA/cm^2$) for 250 milliseconds (ms) and a current of 20 $mA/cm^2$ for 50 ms over a period of 30 minutes (min).

Step v): dissolving said porous membrane 3, e.g. by immersion in a 1 molar (M) solution of sodium hydroxide at 80° C. for 30 seconds (s), followed by rinsing for 10 s in an aqueous solution of $H_2SO_4$ (1 M) and $CuSO_4$ (1 M).

Dissolving the membrane 3 releases a brush-like structure 10 constituted by a plurality of metal wires of sub-micrometer diameter ("nanowires") 2a projecting from the surface of said substrate 2. The wires 2a constitute the imprint of the pores in the membrane: the characteristics of the membrane consequently determine the diameter, the density, and the length of the nanowires.

The present inventors have performed various tests using different porous alumina membranes that are commercially available. Under no circumstances were they able to achieve electrical and mechanical interconnection of sufficient strength by pressing together two structures as obtained in this way after placing them face to face.

Unexpectedly, the inventors have observed that an interconnection presenting good electrical and mechanical properties can be obtained, providing the nanowires are thinned down beforehand by an additional step (step vi)) of controlled partial dissolution. It would appear that the greater porosity of these "brushes" after this partial dissolution step enables the nanowires to interpenetrate better and thus achieves more intimate contact between the two structures that are pressed one against the other.

Figure 2:
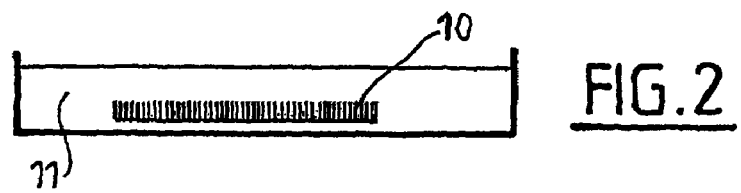
FIG. 2 shows the step vi) of the same method.

This controlled dissolution may be performed by various methods, and in particular with or without current or imposed bias. The method without current or imposed bias, said to be "electroless" and shown in FIG. 2, is performed merely by immersing the structure 10 in a solution 11 that enables the metal constituting the nanowires to be dissolved in controlled manner. The solution must enable the metal to be oxidized and must be capable of dissolving the products of oxidizing the metal. For example, the solution may be a mixture of an acid with a compound that is more oxidizing than the metal that is to be dissolved. For example, with nanowires made of copper, it is possible to use a mixture of $H_2SO_4$ at a concentration lying in the range 0.01 M to 1 M (preferably equal to 0.1 M) together with $H_2O_2$ at a concentration lying in the range 0.3 M to 0.003 M (preferably 0.03 M).

A basic solution may be used as a replacement for the acid solution of the example.

Other methods requiring an anode potential or current to be applied also enable partial controlled dissolution of the nanowires. Amongst these methods, mention may be made of galvanostatic, potentiostatic, or indeed pulsed bias using direct current (DC) or alternating current (AC) potential or current. Under such circumstances, dissolution may be performed in the same solution 1 as is used for the deposition step iv).

The interconnection element obtained at the end of step iv) of controlled partial dissolution typically presents $10^7$ to $10^{10}$ wires per square centimeter (wire·$cm^{-2}$) (preferably of the order of $10^9$), said wires presenting a diameter that generally lies in the range 5 nm to 300 nm, and preferably in the range 10 nm to 200 nm, and a length that generally lies in the range 200 nm to 200 µm, and preferably in the range 500 nm to 100 µm. Generally, the length of the wires is less than or equal to the thickness of the membrane.

The porosity of the interconnection element (defined as being the ratio of the volume of the empty space to the total volume of the "brush") typically lies in the range 0.5 to 0.9, and is typically about 0.75, although this parameter is difficult to measure accurately.

Figure 3A:
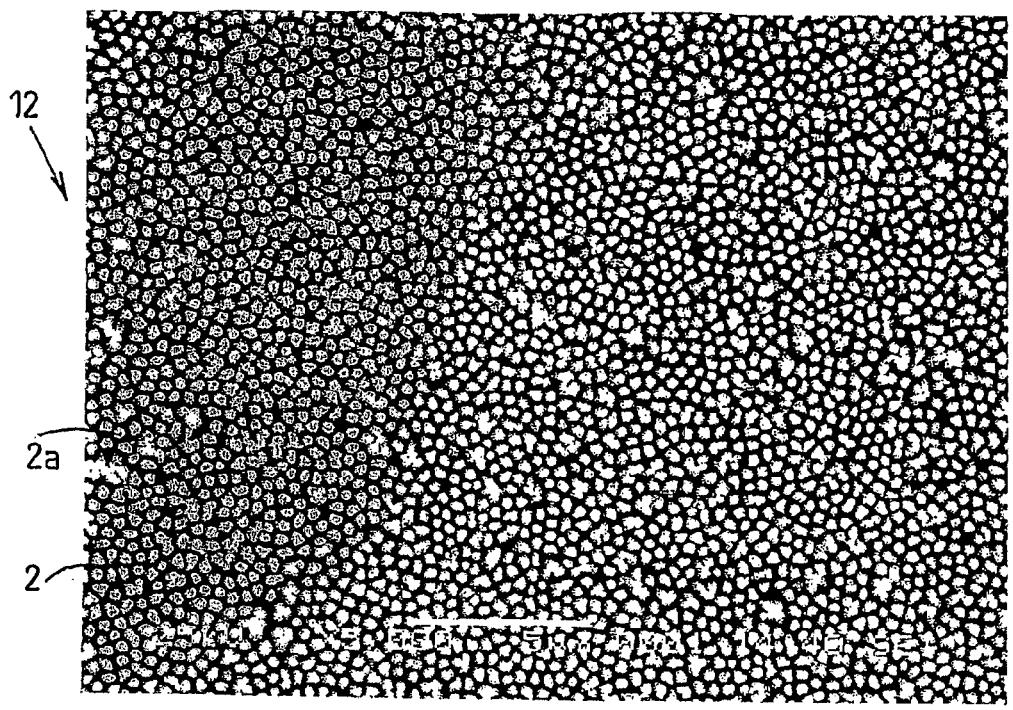
FIG. 3A is an electron microscope view from above of an interconnection element made in accordance with the method of the invention.

FIG. 3A is an electron microscope view of an interconnection element 12 made by a method of the invention and comprising a copper substrate 2 having nanowires 2a also made of copper projecting from its surface, these nanowires presenting a length of about 3 µm and a diameter of about 200 nm. The density of nanowires F is about $10^9$ $cm^{-2}$.

Figure 3B:
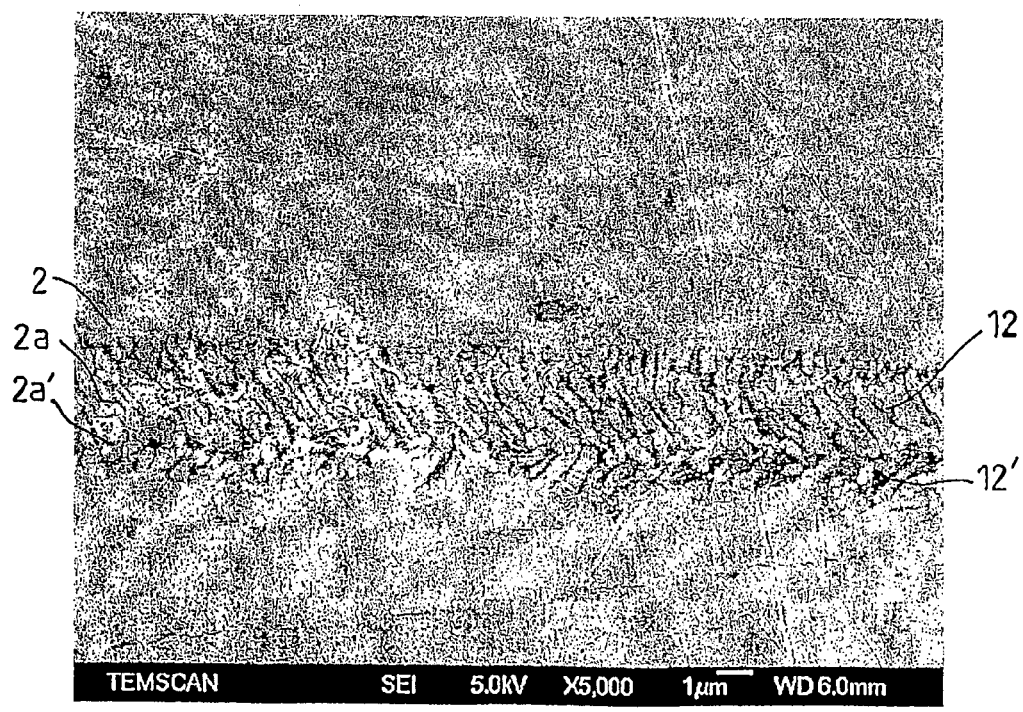
FIG. 3B is a scanning electron microscope view from the side of an electrical and mechanical interconnection made in accordance with the method of the invention.

FIG. 3B is an electron microscope view of an interconnection made by pressing two identical interconnection elements 12 and 12' of the type shown in FIG. 3A one against the other. It can be seen that the nanowires 2a, 2a' that are responsible for the mechanical connection interpenetrate and tangle with one another. The interconnection was made by applying a pressure of 50 MPa, and the bonding force that acts between the elements 12 and 12' is of the order of 5 newtons per square centimeter ($N/cm^2$). This interconnection can be overcome merely by applying traction, without apparently damaging the nanowires. Three cycles of making and breaking the interconnection can be performed in succession without the bonding force decreasing significantly.

More generally, the pressures used for forming interconnections may lie in the range 20 MPa to 100 MPa, with the bonding forces lying in the range 3 $N/cm^2$ to 10 $N/cm^2$.

The interconnection elements of the invention may be used for making flip-chip electronic assemblies. Under such circumstances, the areas of metal plating on the chip and on the integrated circuit are used as substrates onto which nanowires are deposited electrochemically. Compared with conventional electronic assembly techniques, using an interconnection of this type serves to avoid any risk of the chip being overheated during a soldering step. In addition, removing the chip, which may be necessary for test, repair, or replacement purposes, is made much easier.

Preferably, the interconnection elements thus provide both electrical connection and mechanical connection, and sometimes also thermal connection. However these functions may also be separate.

A particularly advantageous application of the invention lies in three-dimensional integration, which consists in stacking planar devices such as chips or miniature printed circuits. One three-dimensional integration technique that is known in the prior art is described in document EP 0 490 739. The interconnection elements of the invention can simplify making such three-dimensional devices, by providing both mechanical connections and electrical connections between the various planar devices. A three-dimensional device fabricated in this way presents the considerable advantage of being capable of being dismantled, which is hardly conceivable when using prior art techniques.

Figure 4A:
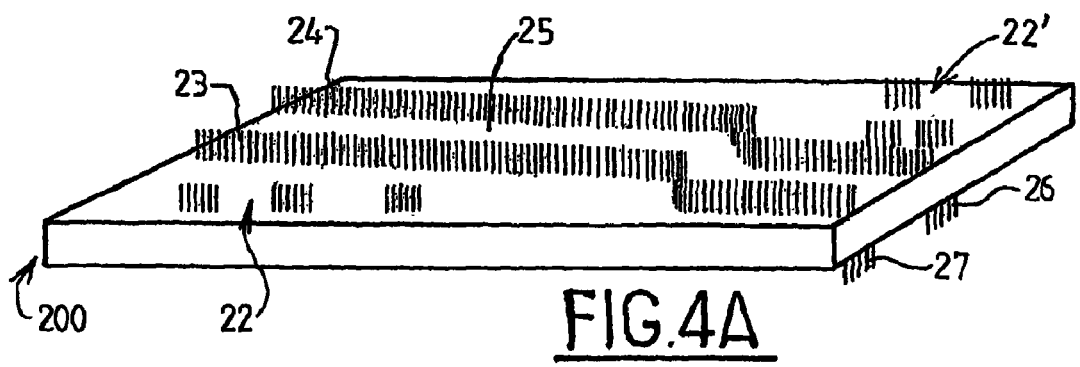
FIGS. 4A and 4B show a particular example of a microelectronic structure using mechanical interconnections that may be obtained by the method of the invention.
Figure 4B:
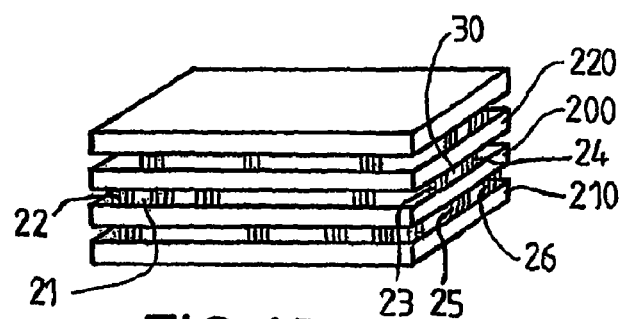

Three-dimensional integration raises severe problems of heat dissipation; the interconnection elements of the invention are capable of providing an original solution thereto, as shown in FIGS. 4A and 4B.

FIG. 4A shows a microelectronic chip 200 that is to form part of a three-dimensional stack of integrated circuits. Its top surface, referenced 21, and its bottom surface (not shown) carry interconnection elements made by the method of the invention, using areas of metal plating as substrates. Two groups of interconnection elements 22 and 22' of substantially square shape can be seen; these interconnection elements serve to pass electrical signals and they contribute to forming a mechanical bond between the chip 200 and the other chips (references 210 and 220 in FIG. 4B) that are to be placed above and below it. The interconnection elements 23 and 24 are in the form of parallel strips (not necessarily rectilinear strips) that cross the chip 200 from one side to the other. These interconnection elements are electrically insulated from the chip (their substrate is constituted by metal plating formed on an insulating layer, e.g. made of $SiO_2$). Similarly, the region 25 of the surface of the chip lying between the strips 23 and 24 is passivated. It can be seen in the figure that the bottom surface of the chip likewise presents interconnection elements in the form of parallel strips 26 and 27.

When a plurality of chips of the same type presenting corresponding interconnection elements are stacked and pressed against one another, a three-dimensional structure is obtained of the type shown in FIG. 4B.

FIG. 4B shows that the conductor elements in the form of strips 23, 24 and the region 25 defined between them cooperate with the corresponding portions of the adjacent chip 210 to form a channel or tube 30. The interconnection elements 23, 24 form leak-proof walls: consequently, it is possible to cause a cooling fluid to flow in the channel (and in all of the channels formed at the interfaces between the various chips) for the purpose of removing the heat dissipated by the electronic circuits of the structure.

The invention claimed is:

1. A method of fabricating an electrically conductive mechanical interconnection element, said method comprising:
   i) placing in an electrolytic cell, an electrolytic solution of a compound that is a precursor of a metallic material;
   ii) immersing in said solution a conductive substrate having at least one face coated in a porous membrane presenting a substantially regular array of rectilinear through pores;
   iii) providing an electrode facing said or each porous membrane, but spaced apart therefrom;
   iv) connecting said substrate to a negative terminal of an electricity generator so as to constitute a cathode, and connecting said electrode to a positive terminal of said generator so as to constitute an anode, in order to perform electrolytic deposition of said metallic material on the surface of the substrate through the pores of said membrane;
   v) dissolving said porous membrane so as to release a structure comprising a plurality of wires of sub-micrometric diameter made of said metallic material and projecting from the surface of said substrate;
   said method further comprising:
   vi) controlled partial dissolution of said wires to reduce the diameter thereof so as to increase the force of adhesion that acts between two said structures as a result of said wires interpenetrating and tangling together when the structures are pressed one against the other.

2. A method according to claim 1, wherein said porous membrane comprises a ceramic material.

3. A method according to claim 2, wherein said porous membrane comprises alumina.

4. A method according to claim 1, wherein said porous membrane has a pore density in the range of from $10^7$ cm$^{-2}$ to $10^{10}$ cm$^{-2}$.

5. A method according to claim 1, wherein, after said controlled partial dissolution, said wires have a diameter in the range of from 5 nm to 300 nm.

6. A method according to claim 1, wherein, after said controlled partial dissolution, said wires have a length in the range of from 200 nm to 200 μm.

7. A method according to claim 1, wherein, after said controlled partial dissolution, said interconnection element has a porosity in the range of from 0.5 to 0.9.

8. A method according to claim 1, wherein said metallic material is selected from the group consisting of Cu, Sn, Co, Fe, Pb, Ni, Cr, Au, Pd, Pt, Ag, Bi, Sb, Al, Si, and Li, and alloys of said metals.

9. A method according to claim 1, wherein said metallic material is the same as the material that constitutes said conductive substrate so as to obtain an interconnection structure made of a single material.

10. A method according to claim 1, wherein said controlled partial dissolution is an electrolytic dissolution method.

11. A method according to claim 1, wherein said controlled partial dissolution comprises immersing said structure in a solution enabling said metallic material to be oxidized and also enabling the oxidation products thereof to be dissolved.

12. A method according to claim 1, wherein said conductive substrate comprises an area of metal plating on a microelectronic chip.

13. A method according to claim 12 wherein said conductive substrate comprises a track or an area of metal plating on a printed circuit.

14. A method according to claim 12, wherein said mechanical interconnection element also provides an electrical connection.

15. A method of making a mechanical interconnection, the method comprising:
   fabricating two interconnection elements by a method according to claim 1; and
   placing said interconnection elements face to face and pressing one against the other so as to cause the nanometric wires projecting from the surfaces of said elements to interpenetrate and tangle together.

16. A method according to claim 15, wherein said interconnection elements are pressed against one another at a pressure in the range of from 20 MPa to 100 MPa.

17. A method of fabricating a three-dimensional microelectronic device comprising a stack of a plurality of microelectronic chips mechanically and electrically connected to one another, the method comprising forming at least one mechanical interconnection between said chips in accordance with claim 15.

18. A method according to claim 17, wherein at least some of the mechanical interconnection elements connecting said microelectronic chips together form channels that are leaktight for circulating a coolant fluid.

* * * * *